(12) United States Patent
Ishikawa

(10) Patent No.: US 9,917,053 B1
(45) Date of Patent: Mar. 13, 2018

(54) SEMICONDUCTOR DEVICE

(71) Applicant: KABUSHIKI KAISHA TOSHIBA, Tokyo (JP)

(72) Inventor: Takashi Ishikawa, Tama Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/449,493

(22) Filed: Mar. 3, 2017

Related U.S. Application Data

(60) Provisional application No. 62/384,785, filed on Sep. 8, 2016.

(51) Int. Cl.
*H01L 23/525* (2006.01)
*H01L 23/528* (2006.01)
*H01L 29/06* (2006.01)

(52) U.S. Cl.
CPC ...... *H01L 23/5252* (2013.01); *H01L 23/5283* (2013.01); *H01L 29/0649* (2013.01)

(58) Field of Classification Search
CPC .................................................. H01L 23/5252
USPC ................................................... 257/330, 530
See application file for complete search history.

(56) References Cited

U.S. PATENT DOCUMENTS

| 7,790,517 | B2 | 9/2010 | Manabe et al. |
| 7,956,397 | B2 | 6/2011 | Wada et al. |
| 9,502,425 | B2 * | 11/2016 | Choi ................. H01L 27/11206 |
| 2014/0293673 | A1 | 10/2014 | Wu et al. |

FOREIGN PATENT DOCUMENTS

| JP | 4249774 | 4/2009 |
| JP | 4427534 | 3/2010 |
| JP | 5893662 | 3/2016 |

* cited by examiner

*Primary Examiner* — Mark Prenty
(74) *Attorney, Agent, or Firm* — Patterson & Sheridan, LLP

(57) ABSTRACT

A semiconductor device includes a semiconductor layer comprising an upper surface and a recess through the upper surface and including a lower part, an upper part, and a side surface, the side surface terminating at the upper surface at an upper edge, an insulating member in the lower part of the recess, an insulating film comprising a first portion on the upper edge of the recess, a second portion on the side surface of the recess in the upper part thereof, and a third portion on a portion of the semiconductor layer adjacent to the upper edge of the recess, and an electrode on the insulating member and the portion of the insulating film covering the upper edge of the recess. The first portion of the insulating film is thinner than thicknesses of each of the second and third portions thereof.

19 Claims, 8 Drawing Sheets

SEMICONDUCTOR DEVICE

CROSS-REFERENCE TO RELATED APPLICATIONS

This application claims benefit of U.S. provisional patent application Ser. No. 62/384,785, filed Sep. 8, 2016, which is herein incorporated by reference.

FIELD

Embodiments hereof relate to a semiconductor device.

BACKGROUND

An anti-fuse element utilizing a MOSFET structure is sometimes provided in a semiconductor device. In such an anti-fuse element, a gate electrode and a semiconductor substrate are insulated from each other by a gate insulating film in an initial state, however, when breakdown occurs in the gate insulating film by applying a predetermined voltage thereacross, the gate electrode and the semiconductor substrate are electrically connected to each other. According to this, for example, a redundant circuit becomes available.

DETAILED DESCRIPTION

A semiconductor device according to an embodiment includes a semiconductor layer comprising an upper surface and a recess extending inwardly of the upper surface, the recess including a lower part, an upper part, and a side surface, the side surface terminating at the upper surface of the semiconductor layer at an upper edge, an insulating member in the lower part of the recess, an insulating film comprising a first portion on the upper edge of the recess, a second portion on the side surface of the recess in the upper part thereof, and a third portion on at least a portion of the semiconductor layer adjacent to the upper edge of the recess, and an electrode on the insulating member and on the portion of the insulating film covering the upper edge of the recess, wherein the first portion of the insulating film is thinner than the thicknesses of each of the second portion of the insulating film and of the third portion of the insulating film.

First Embodiment

First, a first embodiment will be described.

Figure 1A:
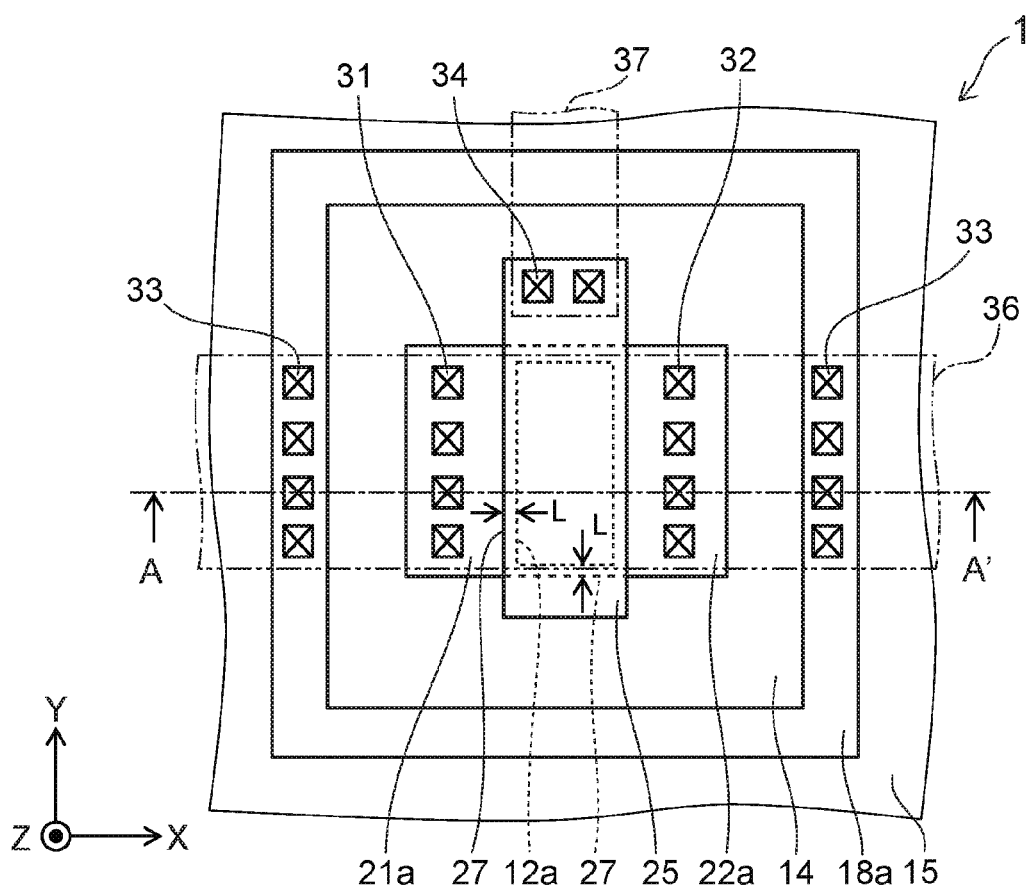
FIG. 1A is a top view showing a semiconductor device according to a first embodiment.
Figure 1B:
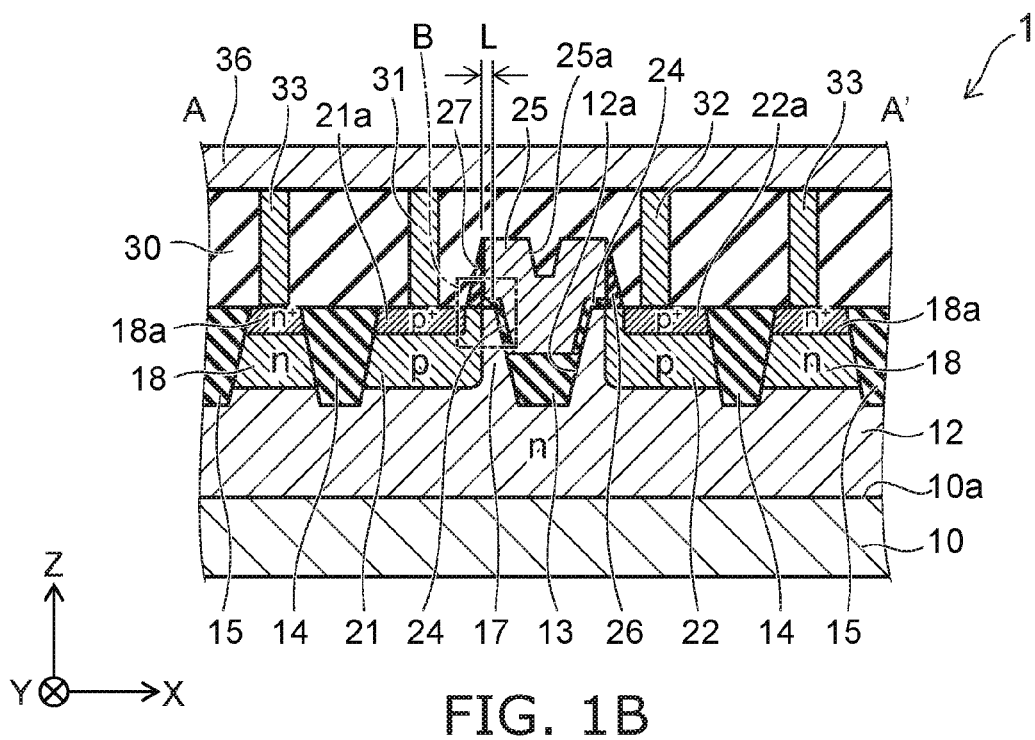
FIG. 1B is a sectional view taken along a line A-A' shown in FIG. 1A.

FIG. 1A is a top view showing a semiconductor device according to the embodiment, and FIG. 1B is a sectional view of the semiconductor device taken along line A-A' shown in FIG. 1A.

Figure 2:
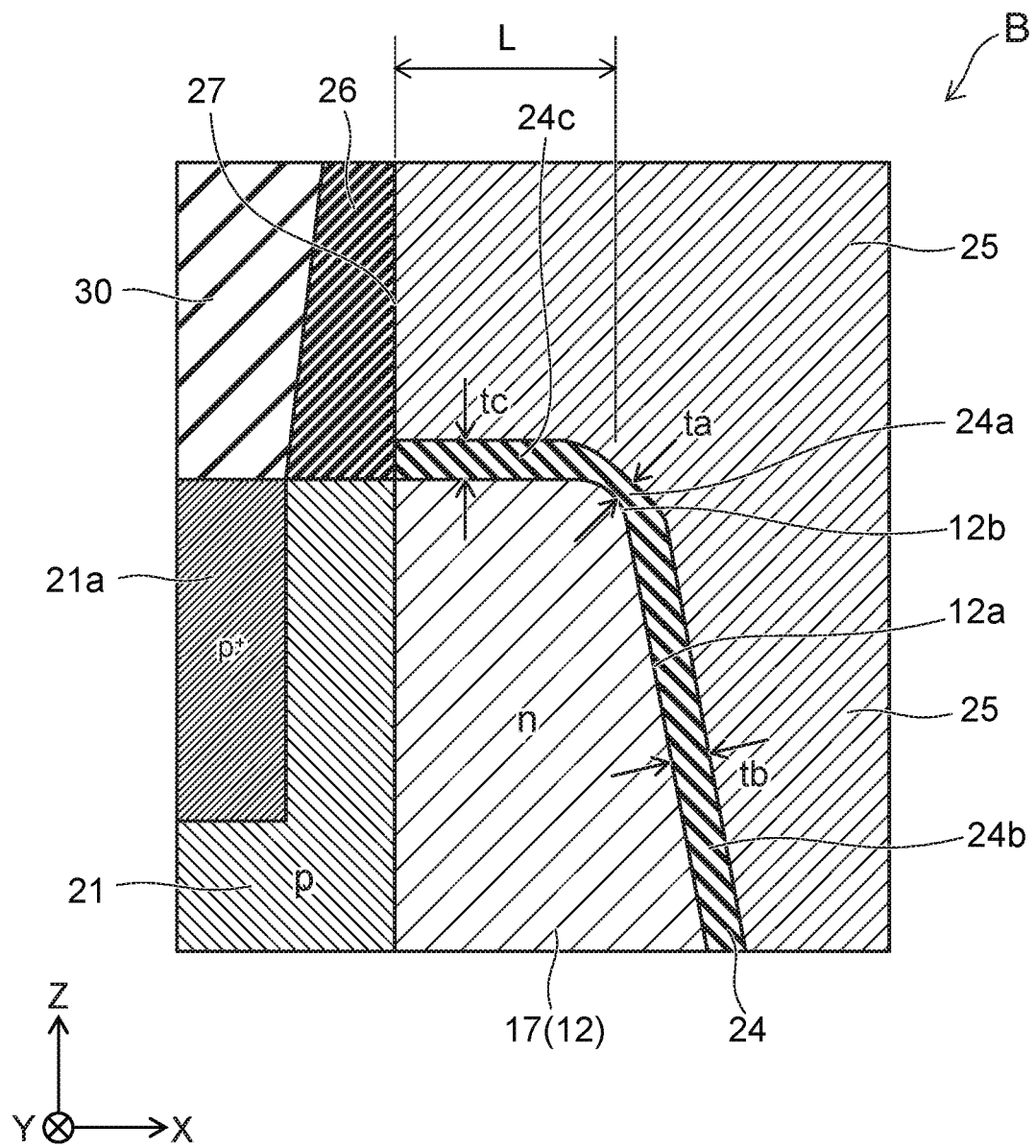
FIG. 2 is a sectional view showing a region B in FIG. 1B.

FIG. 2 is a sectional view showing a region B in FIG. 1B.

The embodiments hereof are schematically illustrated, and for example, an aspect ratio of each constituent member does not necessarily coincide with those of an actual device.

The semiconductor device according to the embodiment is a semiconductor device including a gate insulating film breakdown-type anti-fuse element (eFuse), and is, for example, a semiconductor memory device including a redundant circuit.

As shown in FIGS. 1A and 1B, in a semiconductor device 1 according to the embodiment, a silicon substrate 10 is provided. The silicon substrate 10 is formed of, for example, a silicon (Si) single crystal. Hereinafter, in the specification, for the sake of convenience of description, an XYZ orthogonal coordinate system is adopted. Two directions parallel to an upper surface 10a of the silicon substrate 10 and also orthogonal to each other are referred to as the "X-direction" and the "Y-direction", and a direction perpendicular to the upper surface 10a of the silicon substrate 10 is referred to as the "Z-direction". Further, in the Z-direction, one side of the substrate 10 is referred to as "upper", and the other side is referred to as "lower", however, these expressions are for reference only, and are irrelevant to the direction of gravity.

In a part of an upper layer portion of the silicon substrate 10, for example, an n-type well 12 is provided. In an upper surface of the well 12, a recessed portion 12a is formed. In a lower part in the recessed portion 12a, an STI structure (Shallow Trench Isolation) 13 composed of, for example, silicon oxide (SiO), is provided. The shape of the STI 13 as viewed in the Z-direction is a rectangle. The height of the STI 13 with respect to a depth of the recessed portion 12a is ¾ or less.

In a part of an upper layer portion of the well 12, an STI 14 is provided. The shape of the STI 14 as viewed in the Z-direction is a frame shape surrounding the STI 13. The STI 14 is not in contact with the STI 13. The rectangular region surrounded by the STI 14 in the well 12 becomes an active area 17. The STI 13 is disposed in the active area 17.

In a region surrounding the STI 14 in the well 12, an STI 15 is provided. The STI 15 surrounds the STI 14 and is spaced from the STI 14. A region between the STI 14 and the STI 15 in the silicon substrate 10 becomes a frame-shaped substrate contact region 18. The substrate contact region 18 surrounds the active area 17.

The shape of the active area 17 as viewed in the Z-direction is a rectangle in which the X-direction is a longitudinal direction. On opposed sides in the X-direction of the active area 17, a source region 21 and a drain region 22 are provided. The source region 21 and the drain region 22 are spaced from the recessed portion 12a and disposed such that the recessed portion 12a is interposed therebetween. Thus, the recessed portion 12a is located in the well 12.

The conductivity type of the source region 21 and the drain region 22 is p-type. In an upper part of the source region 21 and on a side of the recessed portion 12a, a p$^+$-type source contact layer 21a is formed. Further, in an upper part of the drain region 22 and on a side of the recessed portion 12a, a p$^+$-type drain contact layer 22a is formed. The carrier concentration in the source contact layer 21a and the drain contact layer 22a is higher than the carrier concentration in the source region 21 and the drain region 22.

The conductivity type of the substrate contact region 18 is n-type. The carrier concentration in the substrate contact region 18 is higher than the carrier concentration in the well 12. In an upper part of the substrate contact region 18, an n$^+$-type substrate contact layer 18a is formed. The carrier concentration in the substrate contact layer 18a is higher than the carrier concentration in the substrate contact region 18.

On a side surface of an upper part of the recessed portion 12a and on an upper surface of the active area 17, a gate insulating film 24 composed of, for example, silicon oxide is provided. The gate insulating film 24 covers an upper edge 12b of the recessed portion 12a. An end portion of the gate insulating film 24 is in contact with the STI 13.

On the gate insulating film 24, a gate electrode 25 is provided. The gate electrode 25 is formed of, for example, a conductive material such as polysilicon. The gate electrode 25 is provided continuously on the STI 13 and on a portion to either side in the X-direction of the STI 13 in the active area 17, and a part of the gate electrode 25 penetrates into the upper part of the recessed portion 12a. Therefore, the gate electrode 25 covers the upper edge 12b of the recessed portion 12a with the gate insulating film 24 therebetween.

As viewed from above, the sidewall 27 of the gate electrode 25 is spaced outwardly of the recessed portion 12a, and the shortest distance L between the recessed portion 12a and the sidewall 27 where the gate electrode 25 overlies the active area 17 is 0.2 μm or less, i.e., 0.2 μm≥L>0. In a region immediately above the recessed portion 12a in an upper surface of the gate electrode 25, a cavity 25a is formed. On a side surface of the gate electrode 25, a sidewall 26 composed of, for example, silicon oxide is provided.

On the silicon substrate 10, an interlayer insulating film 30 is provided so as to cover the gate electrode 25 and the like. In the interlayer insulating film 30, a plurality of contacts 31 to 34 extending in the Z-direction are provided. On the interlayer insulating film 30, upper layer interconnects 36 and 37 are provided. Incidentally, in FIG. 1A, in order to make the drawing easier to understand, the illustration of the sidewall 26 and the interlayer insulating film 30 is omitted, and the upper layer interconnects 36 and 37 are each shown by a two-dot chain line.

The contact 31 is connected between the source contact layer 21a and the upper layer interconnect 36. The contact 32 is connected between the drain contact layer 22a and the upper layer interconnect 36. The contact 33 is connected between the substrate contact layer 18a and the upper layer interconnect 36. In this manner, the source contact layer 21a, the drain contact layer 22a, and the substrate contact layer 18a are short-circuited through the upper layer interconnect 36, i.e., they are electrically connected to have the same electric potential. On the other hand, the contact 34 is connected between the gate electrode 25 and the upper layer interconnect 37.

Then, as shown in FIG. 2, the thickness ta of a portion 24a of the gate insulating film 24 in contact with the upper edge 12b of the active area 17 of the well 12 is thinner than the thickness tb of a portion 24b of the gate insulating film 24 disposed on a side surface of the recessed portion 12a of the active area 17 of the well 12 and a thickness tc of a portion 24c of the gate insulating film 24 disposed on an upper surface of the active area 17. That is, the following relationships are satisfied: ta<tb and ta<tc. For example, the thicknesses of the portion 24b and the portion 24c are each 3 nm, and the thickness of the portion 24a is from 1 to 2 nm. Incidentally, in the case where a ridgeline, i.e., a sharp corner, exists in a boundary between a side surface of the recessed portion 12a and upper surface of the active area 17, the ridgeline is the upper edge 12b of the recessed portion 12a. In the case where a clear ridgeline does not exist between a side surface of the recessed portion 12a and an upper surface of the active area 17, a portion having a maximum curvature in a cross section including the Z-direction is defined as the upper edge 12b.

In the semiconductor device 1 according to the embodiment, an anti-fuse element having an MOS capacitor structure is formed of the active area 17, the gate insulating film 24, and the gate electrode 25. In an initial state, the gate electrode 25 is insulated from the active area 17 by the gate insulating film 24. Then, when a predetermined write voltage of, for example, 7 to 8 V is applied between the upper layer interconnect 36 and the upper layer interconnect 37, the write voltage is applied between the well 12, the source region 21, and the drain region 22 each connected to the upper layer interconnect 36 and the gate electrode 25 connected to the upper layer interconnect 37, and an electric field is concentrated in the portion 24a of the gate insulating film 24 which is thinnest in the portion thereof interposed between the active area 17 and the gate electrode 25, and electrical breakdown occurs in the portion 24a. As a result, the well 12 and the gate electrode 25 are electrically connected to each other, and for example, a redundant circuit connected to the anti-fuse element becomes effective, or a one-bit value is written to the anti-fuse element.

Next, a method for manufacturing a semiconductor device according to the embodiment will be described.

FIGS. 3A to 4C are sectional views showing the method for manufacturing a semiconductor device according to the embodiment.

FIGS. 3A to 3C, and 4B and 4C each show a cross section corresponding to FIG. 1B. FIG. 4A shows a region C in FIG. 3C.

Figure 3A:
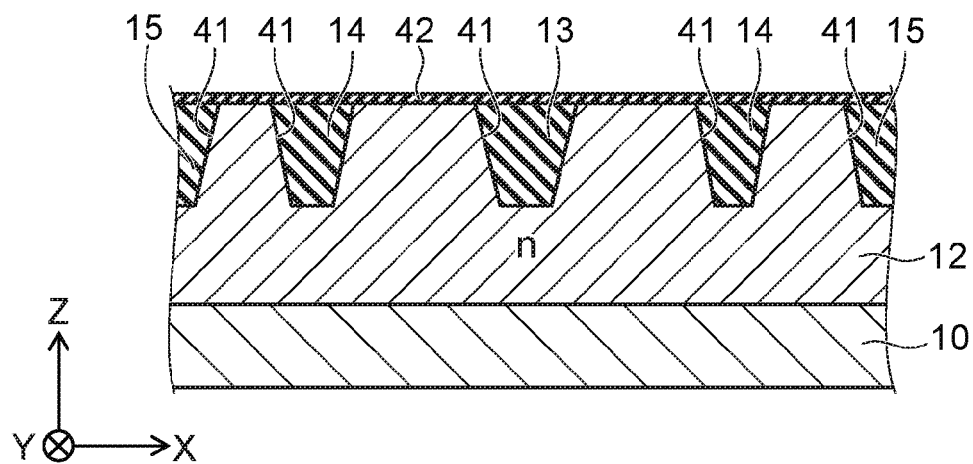
FIGS. 3A to 4C are sectional views showing a method for manufacturing a semiconductor device according to the first embodiment.
Figure 4A:
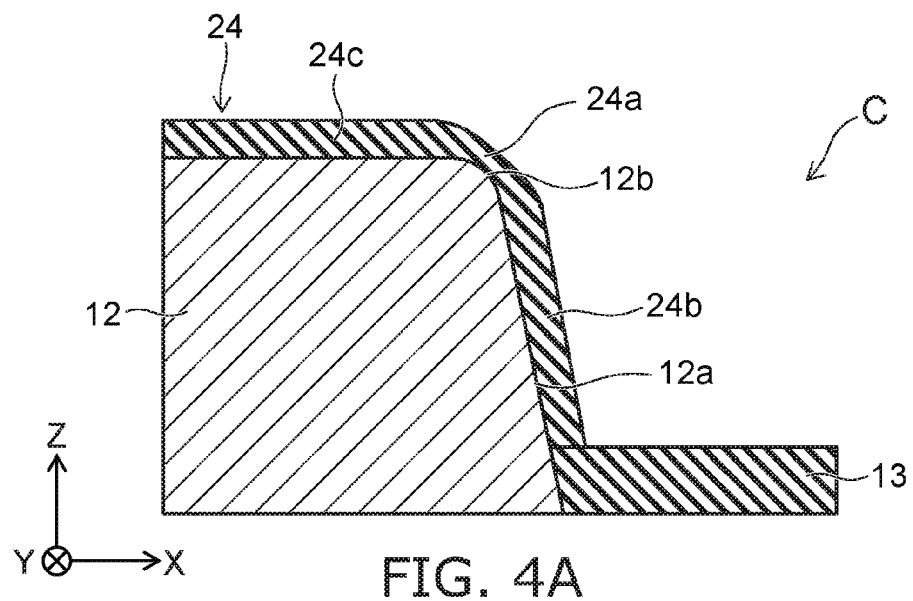

First, as shown in FIG. 3A, a silicon substrate 10 is prepared. Subsequently, an upper layer portion of the silicon substrate 10 is selectively removed, whereby a trench 41 is formed. Subsequently, for example, by a CVD (Chemical Vapor Deposition) method using TEOS (Tetra Ethyl Ortho Silicate: Si(OC$_2$H$_5$)$_4$) as a raw material, a silicon oxide film is formed on the entire surface. Subsequently, by performing CMP (Chemical Mechanical Polishing), the silicon oxide film is left only in the trenches 41. By doing this, STIs 13 to 15 are formed. Subsequently, a sacrificial oxide film 42 is formed on an upper surface of the silicon substrate 10, and an impurity which becomes an acceptor is ion-implanted into a part of the upper layer portion of the silicon substrate 10, followed by a heat treatment, whereby a n-type well 12 is formed on the substrate 10.

Figure 3B:
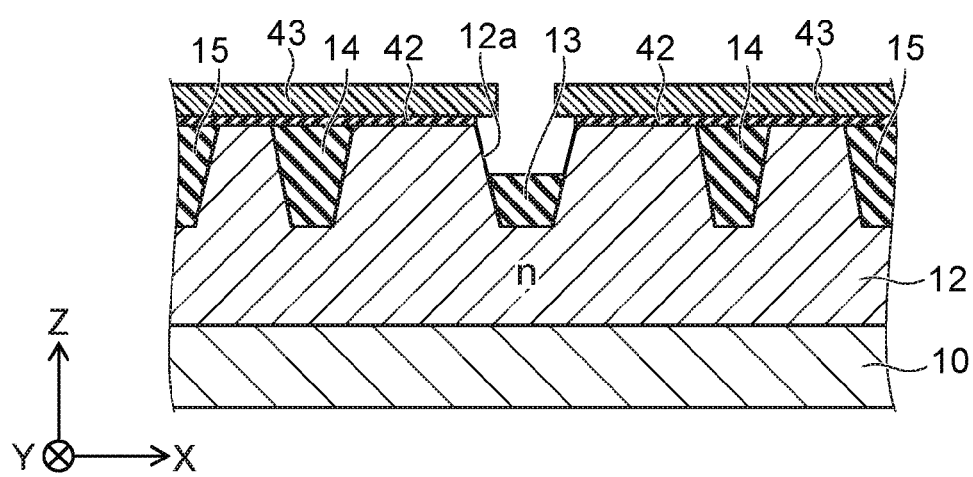

Subsequently, as shown in FIG. 3B, a resist pattern 43 is formed on the sacrificial oxide film 42, and a region immediately above the STI 13 is exposed, and the other surface region of the well 12 is covered. Subsequently, by performing isotropic etching such as wet etching using the resist pattern 43 as a mask, an exposed portion of the sacrificial oxide film 42 and an upper part of the STI 13 are removed, whereby a recessed portion 12a is formed as is shown in FIG. 3B. At this time, one-fourth or more of the STI 13 in the Z-direction is removed.

Figure 3C:
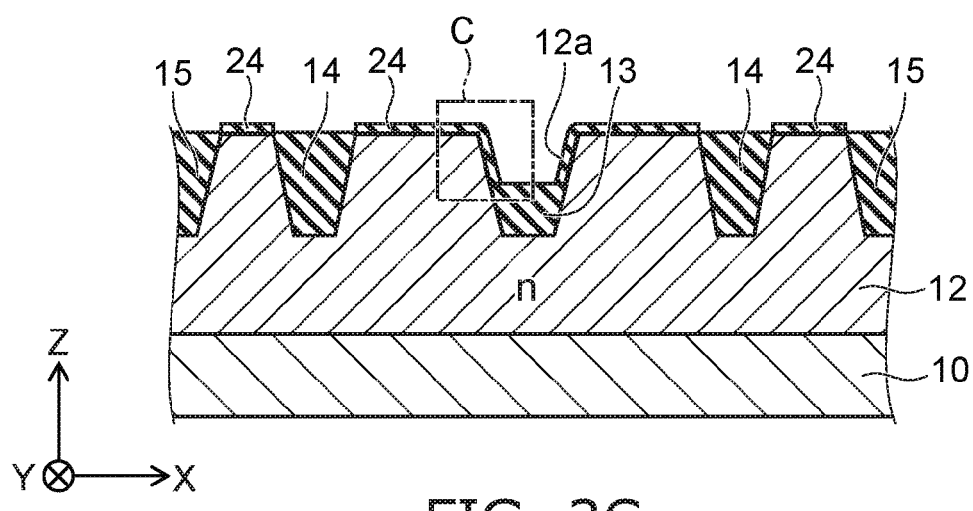

Subsequently, as shown in FIG. 3C, the resist pattern 43 is removed. Subsequently, by performing wet etching, a remaining part of the sacrificial oxide film 42 is removed. Subsequently, by performing a thermal oxidation treatment at a temperature of, for example, 650 to 750° C., the gate insulating film 24 is formed. At this time, as shown in FIG. 4A, a portion 24a of the gate insulating film 24 covering an upper edge 12b of the recessed portion 12a is thinner than the other portions, for example, portions 24b and 24c.

Figure 4B:
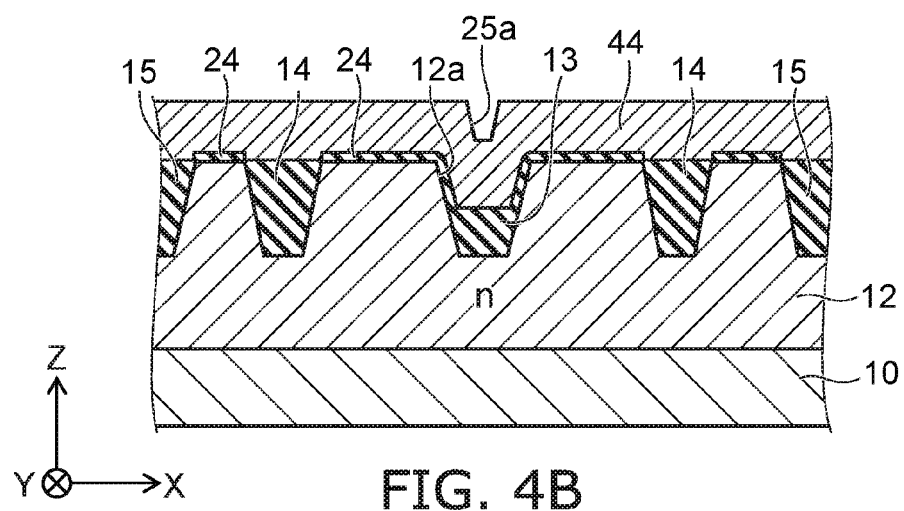

Subsequently, as shown in FIG. 4B, polysilicon is deposited on the entire surface, whereby a silicon film 44 is formed. At this time, in a region immediately above the recessed portion 12a in the silicon film 44, a cavity 25a which reflects the shape of the underlying recessed portion 12a is formed over the location of the STI 13.

Figure 4C:
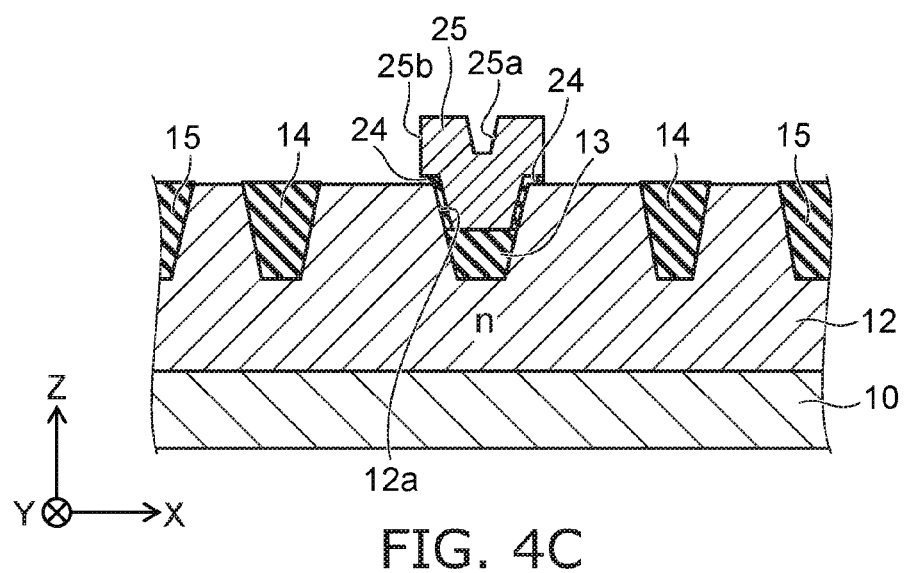

Subsequently, as shown in FIG. 4C, a resist pattern (not shown) is formed on the silicon film 44, and anisotropic etching such as RIE (Reactive Ion Etching) is performed using the resist pattern as a mask. By doing this, the silicon film 44 is processed, whereby a gate electrode 25 is formed therefrom. At this time, as viewed from above (the Z direction), the edge 25b of the gate electrode 25 is located to the outer side of the recessed portion 12a, and the shortest distance L between the recessed portion 12a and the edge 25b of the gate electrode 25 is set to 0.2 µm or less by properly sizing the opening in the mask (not shown). A manufacturing method thereafter is the same as a conventional method. According to this, as shown in FIGS. 1A, 1B, and 2, the semiconductor device 1 according to the embodiment is manufactured.

Next, an effect of the embodiment will be described.

In the embodiment, by forming the recessed portion 12a in the well 12 as shown in FIG. 3B and thereafter forming the gate insulating film 24 as shown in FIG. 3C, the portion 24a covering the upper edge 12b in the gate insulating film 24 can be made thinner (is formed thinner) than the other portions of the gate insulating film 24 as shown in FIG. 4A. According to this, when a predetermined write voltage is applied between the upper layer interconnect 36 and the upper layer interconnect 37, breakdown can be reliably caused in the portion 24a of the gate insulating film 24. Due to this, the reliability of the anti-fuse element of the semiconductor device 1 is high. Further, it is not necessary to excessively increase the write voltage, and therefore, a peripheral circuit can be shrunk.

On the other hand, if the thickness of the gate insulating film 24 is uniform, in the case where the gate insulating film 24 becomes thicker than a design value due to a variation in deposition conditions or the like, breakdown does not occur in the gate insulating film even when a predetermined write voltage is applied, and the device may not function as the anti-fuse element. In order to avoid this phenomenon, it is necessary to sufficiently increase the write voltage, however, in that case, it is necessary to increase the breakdown voltage of all portions to which the write voltage is applied, and therefore, the shrinkage of the semiconductor device is inhibited.

Further, in the embodiment, as viewed from above, the edge 25b of the gate electrode 25 is located spaced from the outer side of the recessed portion 12a. According to this, the gate electrode 25 can be formed so as to cover the upper edge 12b of the recessed portion 12a with the gate insulating film 24 therebetween. As a result, the write voltage can be reliably applied to the portion 24a of the gate insulating film 24, and thus electrical breakdown can be caused at that location.

Further, in the embodiment, the shortest distance L between the recessed portion 12a and the sidewall 27 of the gate electrode 25 and the active area 17 overlap each other is set to 0.2 µm or less. According to this, in a process for patterning the gate electrode 25 shown in FIG. 4C, a margin for alignment is ensured, and the edge 25b is reliably located to the outer side of the recessed portion 12a, and thus, the size of the gate electrode 25 can be prevented from excessively increasing.

In this manner, according to the embodiment, both reliability and shrinkage of the anti-fuse element can be achieved.

Second Embodiment

Next, a second embodiment will be described.

Figure 5A:
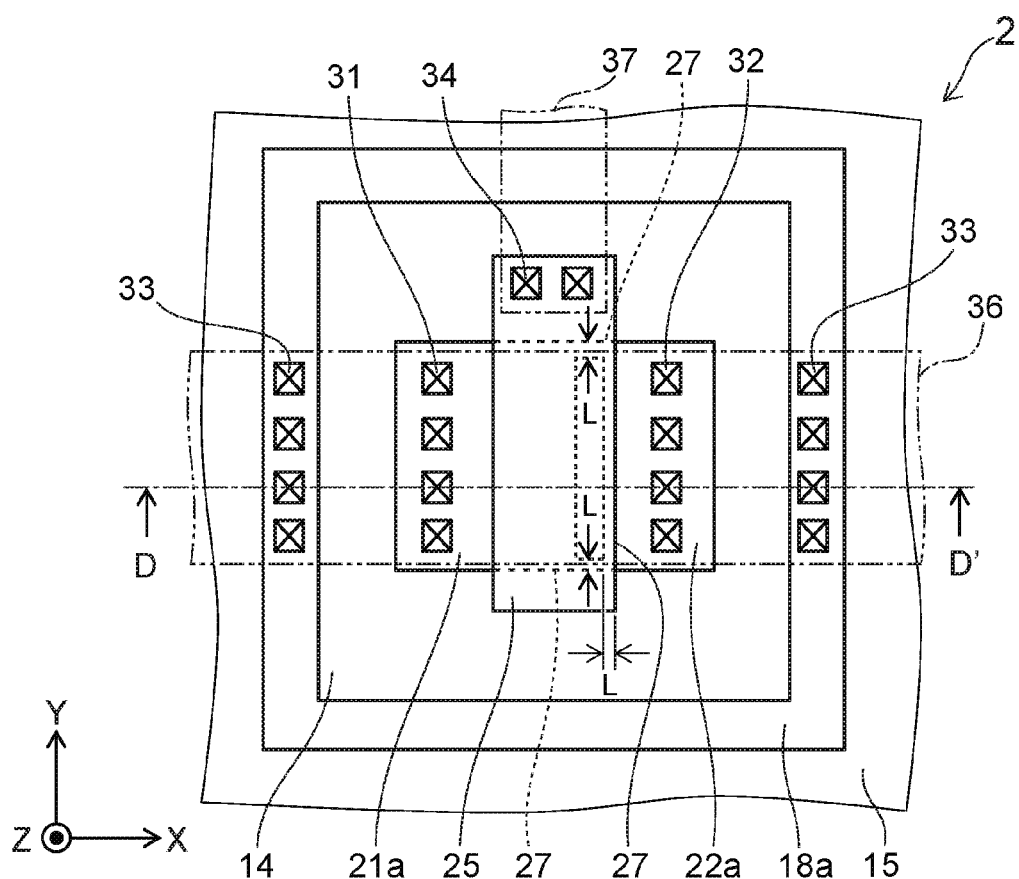
FIG. 5A is a top view showing a semiconductor device according to a second embodiment.
Figure 5B:
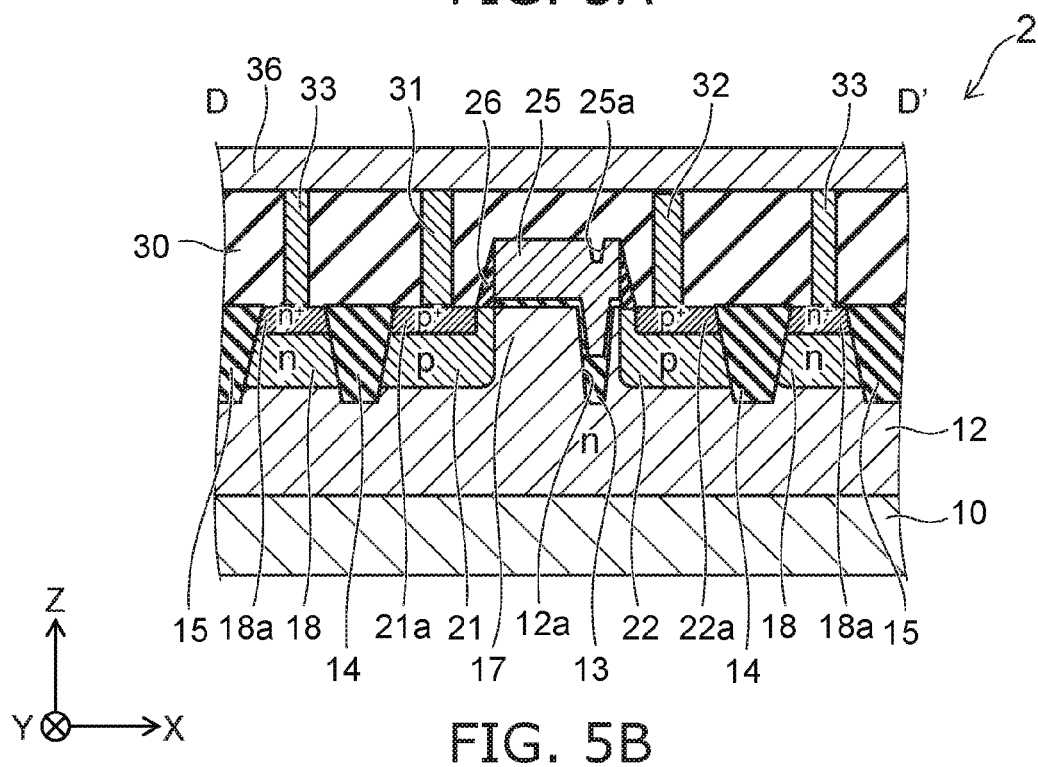
FIG. 5B is a sectional view taken along a line D-D' shown in FIG. 5A.

FIG. 5A is a top view showing a semiconductor device according to the embodiment, and FIG. 5B is a sectional view taken along a line D-D' shown in FIG. 5A.

As shown in FIGS. 5A and 5B, in a semiconductor device 2 according to the embodiment, a recessed portion 12a of a well 12 is disposed on a side of a drain region 22. That is, a distance between a source region 21 and the recessed portion 12a is longer than a distance between the drain region 22 and the recessed portion 12a. Further, a distance L between the recessed portion 12a and a sidewall 27 of the gate electrode 25, as viewed from above, is 0.2 µm or less on a side of the drain region 22 and on both sides in the Y-direction (a channel width direction). On the other hand, on a side of the source region 21, the distance is greater than 0.2 µm. The other elements, operation, manufacturing method, and effect of the embodiment are the same as those of the above-mentioned first embodiment.

Third Embodiment

Next, a third embodiment will be described.

Figure 6A:
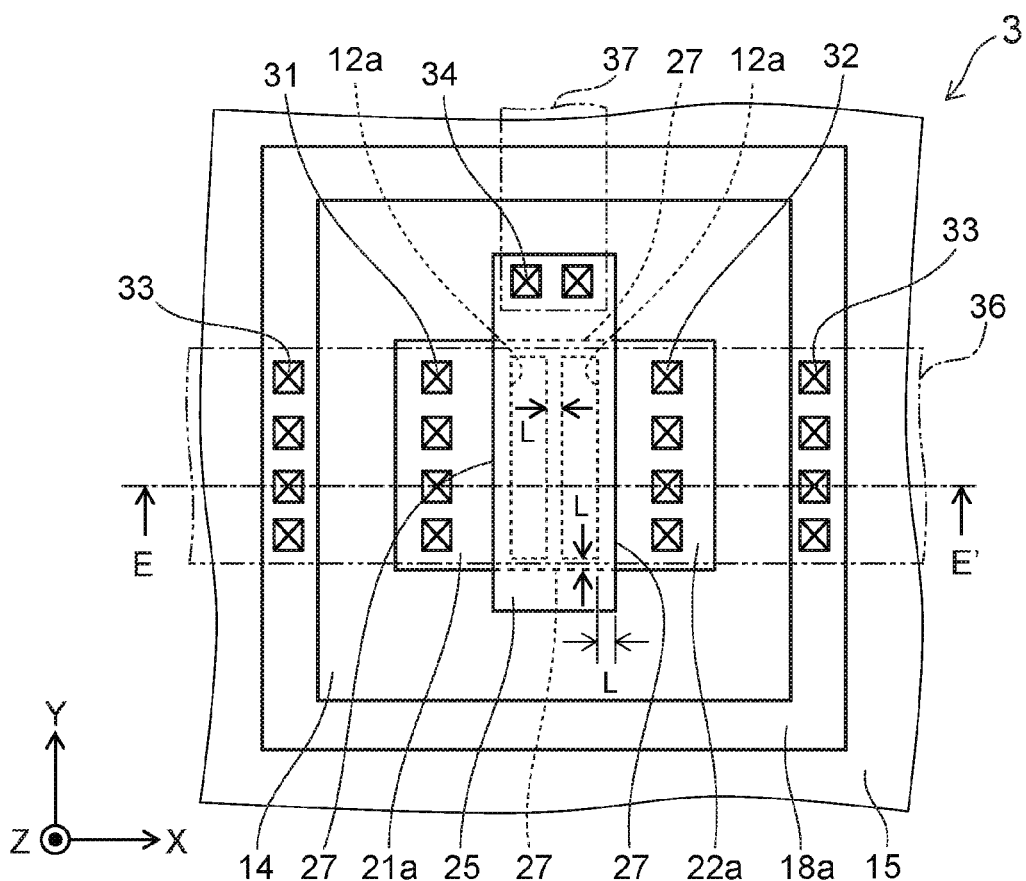
FIG. 6A is a top view showing a semiconductor device according to a third embodiment.
Figure 6B:
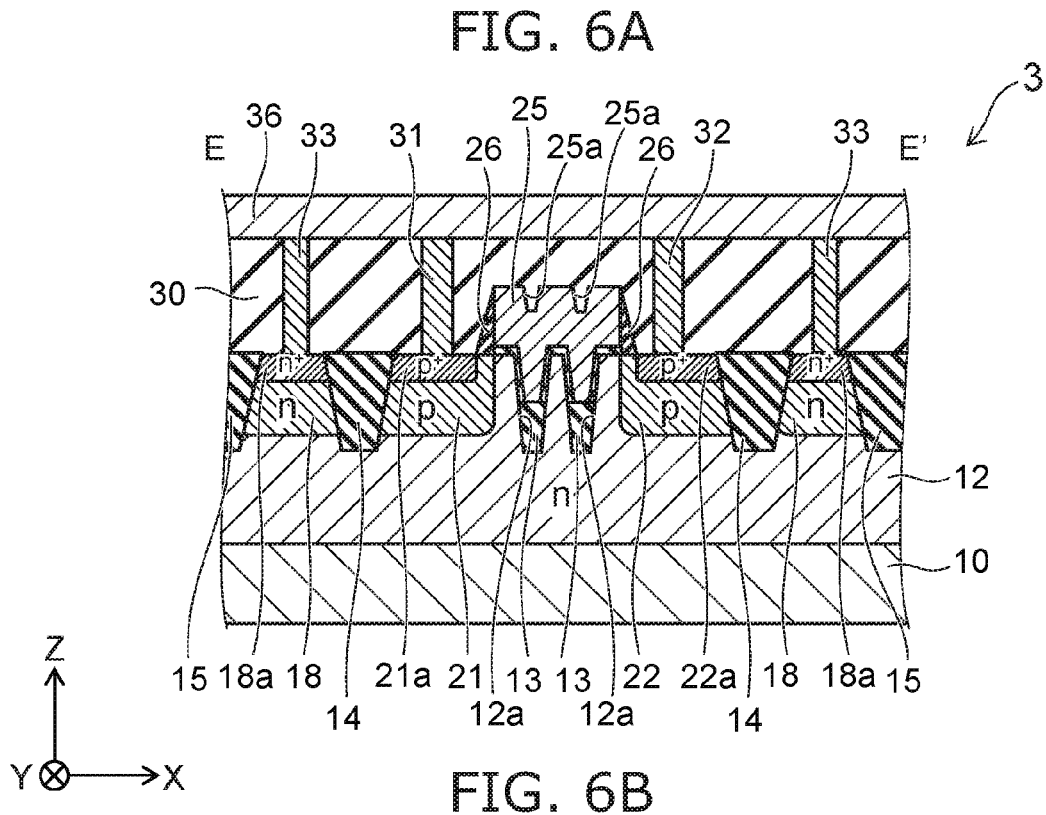
FIG. 6B is a sectional view taken along a line E-E' shown in FIG. 6A.

FIG. 6A is a top view showing a semiconductor device according to the embodiment, and FIG. 6B is a sectional view taken along a line E-E' shown in FIG. 6A.

As shown in FIGS. 6A and 6B, in a semiconductor device 3 according to the embodiment, in a region immediately below the gate electrode 25, two recessed portions 12a are provided. The two recessed portions 12a are arranged in the X-direction, and each recessed portion 12a extends in the Y-direction. Also in this case, a shortest distance L between the recessed portion 12a and an edge 27 of a region where the locations of the gate electrode 25 and an active area 17 overlap with each other, i.e., the minimum span of the side of the electrode 25 from the edge 27 of the recessed portion 12a as viewed from above is 0.2 µm or less. Further, also a distance L between the two recessed portions 12a is, for example, 0.2 µm or less. According to the embodiment, as compared with the above-mentioned first embodiment, a length of a thin portion 24a of a gate insulating film 24 becomes longer and corner portions increase, and therefore, electrical breakdown can be more reliably caused in the gate insulating film 24. The other elements, operation, manufacturing method, and effect of the embodiment are the same as those of the above-mentioned first embodiment.

Fourth Embodiment

Next, a fourth embodiment will be described.

Figure 7A:
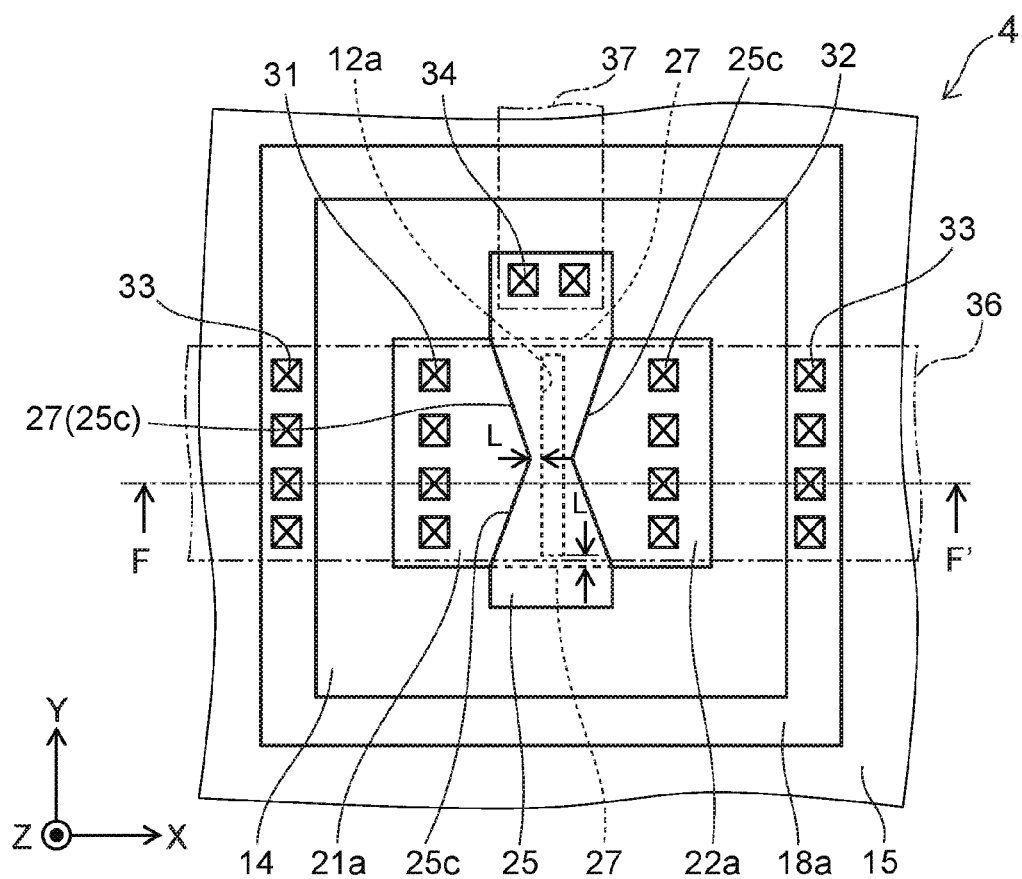
FIG. 7A is a top view showing a semiconductor device according to a fourth embodiment.
Figure 7B:
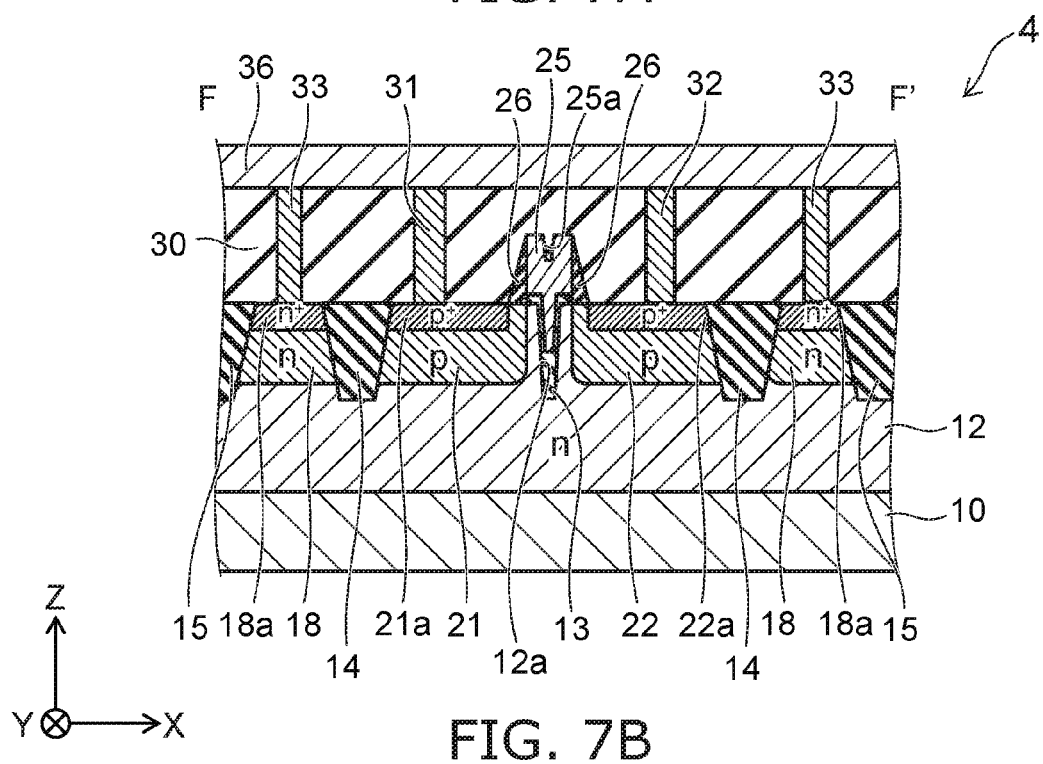
FIG. 7B is a sectional view taken along a line F-F' shown in FIG. 7A.

FIG. 7A is a top view showing a semiconductor device according to the embodiment, and FIG. 7B is a sectional view taken along a line F-F' shown in FIG. 7A.

As shown in FIGS. 7A and 7B, in a semiconductor device 4 according to the embodiment, the width of the gate electrode 25 in a central portion thereof in the Y-direction, that is, a length in the X-direction is smaller than the length of both end portions in the X-direction. The side surface 25c on opposite sides of the gate electrode 25 in the X-direction, a recess is formed. Incidentally, the Y-direction is a longitudinal direction of the gate electrode 25, and is a channel width direction of an MOS structure. Also in this case, a shortest distance L between a recessed portion 12a and an edge 27 of a region where the gate electrode 25 and an active area 17 overlap each other as viewed from an upper side is 0.2 µm or less.

According to the embodiment, when a write voltage is applied between the gate electrode 25 and the active area 17, an electric field is likely to be concentrated in the portion of the recess in the side surface 25c of the gate electrode 25, and therefore, electrical breakdown is likely to occur in the gate insulating film 24 adjacent to this portion. According to this, when a write voltage is applied, breakdown can be more reliably caused in the gate insulating film 24. The other elements, operation, manufacturing method, and effect of the embodiment are the same as those of the above-mentioned first embodiment.

Fifth Embodiment

Next, a fifth embodiment will be described.

Figure 8A:
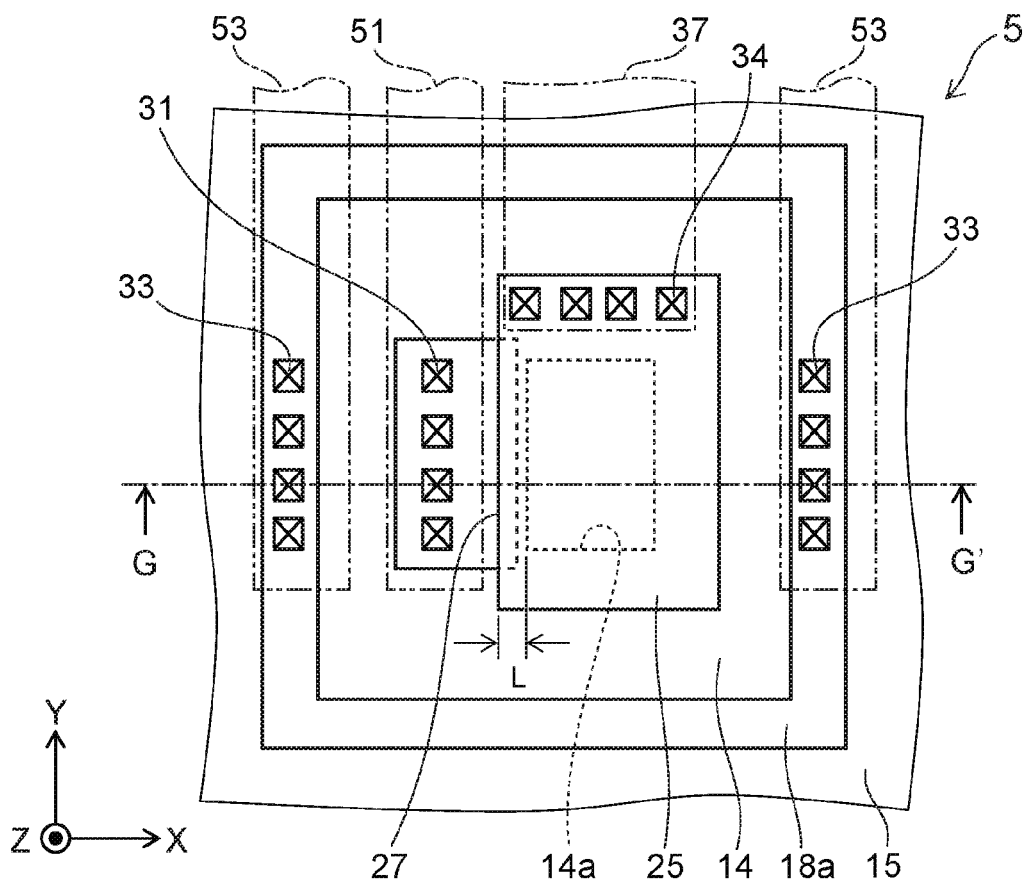
FIG. 8A is a top view showing a semiconductor device according to a fifth embodiment.
Figure 8B:
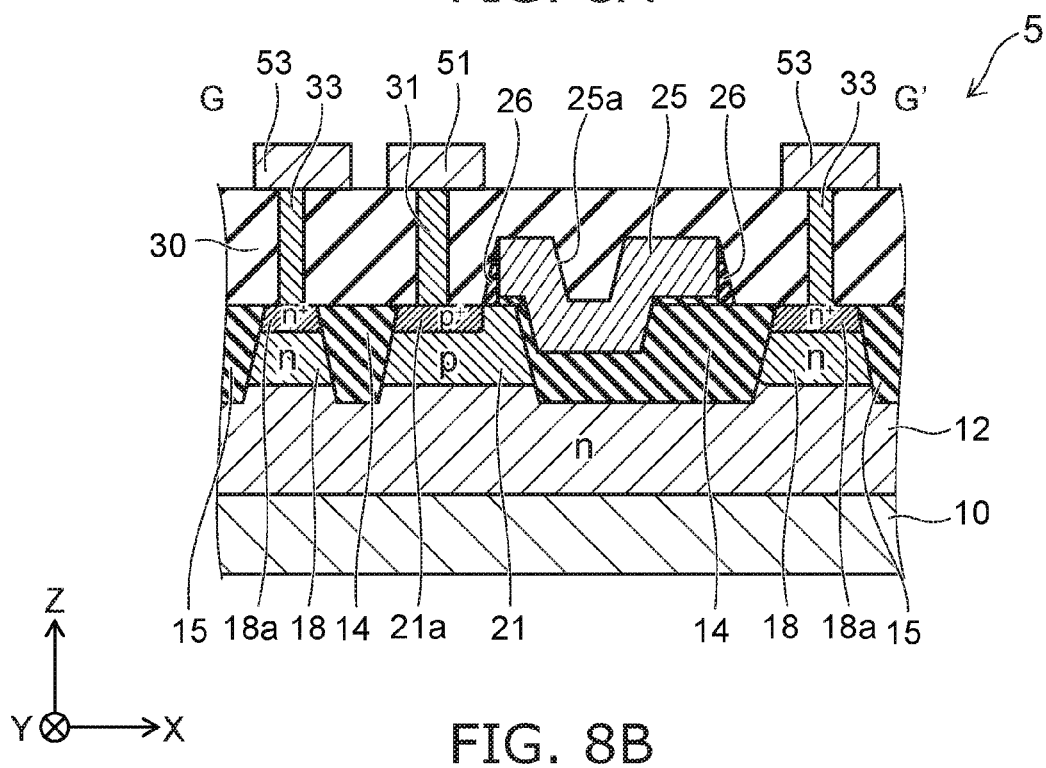
FIG. 8B is a sectional view taken along a line G-G' shown in FIG. 8A.

FIG. 8A is a top view showing a semiconductor device according to the embodiment, and FIG. 8B is a sectional view taken along a line G-G' shown in FIG. 8A.

As shown in FIGS. 8A and 8B, a semiconductor device 5 according to the embodiment differs in the following points as compared with the semiconductor device 1 (see FIGS. 1A and 1B) according to the above-mentioned first embodiment. Firstly, in the semiconductor device 5, a drain region 22 and a STI 13 are not provided. Secondly, in an upper surface of the STI 14, a recessed portion 14a is formed. Thirdly, a gate electrode 25 extends from over a source region 21 to the STI 14, and a part of a gate electrode 25 extends into the recessed portion 14a. Fourthly, a contact 31 is connected to an upper layer interconnect 51 extending in the Y-direction, and a contact 33 is connected to an upper layer interconnect 53 extending in the Y-direction.

A gate insulating film 24 is provided over the upper surface of the source region 21, the side surface of the recessed portion 14a of the STI 14 and over an upper edge 14b of the recessed portion 14a. Then, a portion 24a of the gate insulating film 24 in contact with the upper edge 14b is thinner than a portion 24b disposed on a side surface of the recessed portion 14a and a portion 24c disposed on the source region 21. Incidentally, the shortest distance L between the recessed portion 14a and an edge 27 of a region where the gate electrode 25 and the source region 21 overlap with each other as viewed from above is 0.2 µm or less.

Also, according to the embodiment, an anti-fuse element can be realized by utilizing a gate capacitor structure. The other configuration, operation, manufacturing method, and effect of the embodiment are the same as those of the above-mentioned first embodiment.

According to the embodiments described above, a semiconductor device including an anti-fuse element with high reliability can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device, comprising:
    a semiconductor layer having an upper surface and a recess extending inwardly of the upper surface, the recess including a lower part, an upper part, and a side surface, the side surface terminating at the upper surface of the semiconductor layer at an upper edge;
    an insulating member in the lower part of the recess;
    an insulating film comprising a first portion on the upper edge of the recess, a second portion on the side surface of the recess in the upper part thereof, and a third portion on the upper surface of the semiconductor layer on at least a portion of the upper surface adjacent to the upper edge; and
    an electrode on the insulating member and on the first portion of the insulating film, the first portion of insulating film separating the electrode from the upper edge of the recess, wherein
    the first portion of the insulating film has a thickness between the semiconductor layer and the electrode that is less than a thickness of the second portion of the insulating film between the semiconductor layer and the electrode and a thickness of the third portion of the insulating film between the semiconductor and the electrode.

2. The semiconductor device according to claim 1, further comprising:
    an interconnect; and
    a first contact connected to the interconnect, wherein
    the semiconductor layer further comprises: a first region of a first conductivity type in which the recess extends, the upper edge of the recess being a portion of the first region, and a second region of a second conductivity type, the second region being spaced from the recess in a direction parallel to the first surface and in electrical contact with the first contact.

3. The semiconductor device according to claim 2, further comprising a second contact connected to the interconnect, wherein
    the semiconductor layer further comprises a third region of the second conductivity type that is spaced from the recess and electrically connected to the second contact, and
    the recess is between the second region and the third region.

4. The semiconductor device according to claim 3, wherein a distance between the second region and the recess along the direction parallel to the first surface is greater than a distance between the third region and the recess along the direction parallel to the first surface.

5. The semiconductor device according to claim 2, further comprising a second recess extending inwardly of the first region of the semiconductor layer.

6. The semiconductor device according to claim 1, wherein
    the electrode extends in a first direction between a first end and a second end and has opposed side surfaces spaced from each other in a second direction crossing the first direction, the opposed side surface extending along the first direction between the first and second ends of the electrode, and
    the width of the electrode in the second direction at a position between the first and second ends in the first direction, is less than the width of the electrode in the second direction at either of the first and second ends of the electrode.

7. The semiconductor device according to claim 1, further comprising:

an interconnect; and
a first contact connected to the interconnect, wherein the semiconductor layer further comprises:
  a first region of a first conductivity type; and
  a second region of a second conductivity type adjacent to the first region and electrically connected to the first contact.

8. The semiconductor device according to claim 1, wherein the thickness of the insulating member is not greater than 75% of the depth of the recess into the semiconductor layer from the first surface.

9. The semiconductor device according to claim 1, wherein the semiconductor layer further comprises:
  a first region of a first conductivity type; and
  a second region of a second conductivity type adjacent to the first region, wherein
  the shortest distance between the recess and the second region is less than or equal to 0.2 µm.

10. The semiconductor device according to claim 1, further comprising:
  an interconnect;
  a first contact connected to the interconnect; and
  a second contact connected to the interconnect, wherein the semiconductor layer further comprises:
    a well of a first conductivity type;
    a first semiconductor region of a second conductivity type contacting the well and electrically connected to the first contact; and
    a second semiconductor region of the first conductivity type and contacting the well in a location other than where the first semiconductor region contacts the well, and having a carrier concentration that is greater than a carrier concentration of the well, the second semiconductor region being electrically connected to the second contact.

11. The semiconductor device according to claim 10, wherein the well is the upper edge of the recess.

12. The semiconductor device according to claim 10, wherein the second semiconductor region surrounds the first semiconductor region in a plane parallel to the first surface.

13. The semiconductor device according to claim 1, wherein a cavity is in an upper surface of the electrode in a region immediately above the recess.

14. A semiconductor device, comprising:
  a first semiconductor region having a first surface;
  a first recess extending inwardly of the first surface, the first recess comprising a base, a sidewall, and an upper edge at the intersection of the sidewall and the first surface;
  an insulator in the first recess, an upper surface of the insulator recessed inwardly of the first surface;
  a first insulating layer disposed on the sidewall of the first recess above the insulator, the upper edge of the first recess, and the first surface;
  an electrode on the insulator in the recess and a portion of the first insulating layer that is on the first surface, the electrode having a sidewall portion over the first surface outside the upper edge of the first recess; and
  a second semiconductor region adjacent to the first semiconductor region in a first direction parallel to the first surface, the second semiconductor region spaced in the first direction from the upper edge of the first recess, wherein the minimum distance between the upper edge of the first recess and the sidewall portion of the electrode is greater than zero, wherein
  a thickness of a first portion the first insulating layer disposed on the upper edge of the first recess is less than a thickness of a second portion the first insulating layer disposed on the sidewall of the first recess above the insulator and a thickness of a third portion of the first insulating layer disposed on the first surface.

15. The semiconductor device according to claim 14, wherein the minimum distance between the upper edge of the first recess and the sidewall portion of the electrode is less than or equal to 0.2 µm.

16. The semiconductor device according to claim 14, wherein
  the first semiconductor region is a first conductivity type, and
  the second semiconductor region is a second conductivity type.

17. The semiconductor device according to claim 16, further comprising:
  a second insulating layer overlying the electrode and the second semiconductor layer;
  a first conductor on the second insulating layer; and
  a first contact extending through the second insulating layer and from the first conductor to the second semiconductor region.

18. The semiconductor device according to claim 16, further comprising a second recess extending inwardly of the first surface and surrounding the first recess in a plane parallel to the first surface.

19. The semiconductor device according to claim 18, wherein the second semiconductor region is between the first recess and the second recess.

* * * * *